United States Patent [19]
Miyanaga et al.

[11] Patent Number: 5,932,893
[45] Date of Patent: Aug. 3, 1999

[54] SEMICONDUCTOR DEVICE HAVING DOPED POLYCRYSTALLINE LAYER

[75] Inventors: Akiharu Miyanaga; Hisashi Ohtani; Satoshi Teramoto, all of Kanagawa, Japan

[73] Assignee: Semiconductor Energy Laboratory Co., Ltd., Kanagawa, Japan

[21] Appl. No.: 09/017,672

[22] Filed: Feb. 3, 1998

Related U.S. Application Data

[63] Continuation of application No. 08/258,210, Jun. 10, 1994, abandoned.

[30] Foreign Application Priority Data

Jun. 12, 1993 [JP] Japan ..................................... 5-166117

[51] Int. Cl.⁶ ................................................. H01L 29/76
[52] U.S. Cl. .............................. 257/66; 257/59; 257/72; 257/347; 438/166; 349/41; 349/43
[58] Field of Search ............................... 257/59, 72, 347, 257/60, 66; 438/166; 349/41, 42, 43

[56] References Cited

U.S. PATENT DOCUMENTS 5,705,829 1/1998 Miyanaga et al. .................... 257/66

OTHER PUBLICATIONS

Wu et al., J. Appl. Phys. 65(10), 1989, 4036–4039.
R.J. Nemanich et al., J. Vac. Sci. Technol., 19(3), 1981, 685–688, "Interference Enhanced Raman Scattering Study of the Interfacial Reaction of Pd on a–Si:H".
G. Radnoczi et al., J. Appl. Phys., 69(9), 1991, 6394–6399, "Al Induced Crystallization of a–Si".
C.C. Tsai, International Electron Devices and Materials Symposium, 1990, "Growth of Amorphous, Microcrystalline, and Epitaxial Silicon in Low Temperature Plasma Deposition".
Choi et al., Japan J.Appl. Phys., 33, 1994, L83–L86, "The Annealing Effects of Excimer–Laser–Produced Large–Grain Poly–Si Thin–Film Transistors".

Primary Examiner—Valencia Martin-Wallace
Attorney, Agent, or Firm—Sixbey, Friedman, Leedom & Ferguson, P.C.; Gerald J. Ferguson, Jr.; Jeffrey L. Costellia

[57] ABSTRACT

An insulated gate field effect transistor comprises a silicon channel region. The silicon is crystallized by heat annealing while a suitable metal element such as nickel helps the crystallization. The crystallization proceeds in the silicon film laterally from the portion where the nickel is directly introduced. The TFT is arranged in such a manner that the source-drain direction of the TFT is aligned with the direction of the crystal growth or intersects with the crystal growth direction at a desired direction.

41 Claims, 5 Drawing Sheets

SEMICONDUCTOR DEVICE HAVING DOPED POLYCRYSTALLINE LAYER

This application is a Continuation of application Ser. No. 08/258,210, filed Jun. 10, 1994, now abandoned.

BACKGROUND OF THE INVENTION

1. Field of the Invention

The present invention relates to a semiconductor device having a TFT (thin film transistor) provided on an insulating substrate such as glass, and a method of manufacturing the semiconductor device.

2. Discussion of the Related Art

As the semiconductor having the TFT formed on the insulating substrate made of glass or the like, there have been known an active liquid crystal display device, an image sensor and the like, which use the TFT for driving a pixel.

A thin film silicon semiconductor is generally used for the TFT used in these devices. The thin film silicon semiconductor is roughly classified into the amorphous silicon semiconductor (a-Si) type and the crystalline silicon semiconductor type. The amorphous silicon semiconductor is most generally used because the manufacturing temperature is low, it can be relatively readily manufactured by a vapor phase method, and the mass productivity is sufficient. However, since the physical properties of the amorphous silicon semiconductor is inferior to the crystalline silicon semiconductor such as the electrical conductivity or the like, there is a strong demand to establish a method for manufacturing the TFT formed of the crystalline silicon semiconductor for the purpose of obtaining the higher speed characteristics in the future. As the crystalline silicon semiconductor, there have been known non-single crystalline silicon semiconductors such as polycrystalline silicon, microcrystalline silicon, amorphous silicon containing crystal components, semi-amorphous silicon having an intermediate state between the crystal property and the amorphous property, and the like. Hereinafter, the non-single crystalline silicon semiconductors having these crystal properties are called a crystalline silicon.

As a method of obtaining the thin film silicon semiconductors with these crystal properties, there have been known the following methods.

(1) A crystalline film is directly formed at the time of film formation.

(2) The energy of a laser illumination is applied to an amorphous semiconductor film which has been previously formed to provide the crystal property.

(3) A heat energy is applied to an amorphous semiconductor film which has been previously formed to provide the crystal property.

However, in the method (1), it is technically difficult to uniformly form a film having the excellent semiconductor physical properties all over the upper surface of a substrate. Further, since the film forming temperature is high, that is, 600° C. or more, there rises such a problem in costs that an inexpensive glass substrate cannot be used. In the method (2), in the case of an example of an excimer laser which is most generally used now, there rises a problem that a through-put is low because a laser beam radiated area is small. Furthermore, the stability of the laser beam is insufficient to uniformly treat the entire upper surface of a large-area substrate, whereby it strongly seems as if this method is the technique for the coming generation. In the method (3), there is an advantage in that this method can cope with the large-area of the substrate in comparison with the methods (1) and (2). However, a high temperature of 600° C. or more is required as a heating temperature, and taking the inexpensive glass substrate used into consideration, it is necessary to further decrease the heating temperature. In particular, the current liquid-crystal display unit advances to a large screen, and for that reason, it is necessary to use a large-scale glass substrate likewise. When such a large-scale glass substrate is used, there rises a serious problem that the contraction or strain of the substrate in the heating process essential to the semiconductor manufacture makes the accuracy in mask matching or the like deteriorate. In particular, in the case of the 7059 glass which is most generally used now, the temperature of the strain point is 593° C., whereby the conventional heat crystallization method causes the substrate to be largely deformed. Moreover, in addition to the temperature problem, since the current process requires heating time of several tens hour or more necessary for crystallization, it is also necessary to shorten the heating time.

SUMMARY OF THE INVENTION

The present invention has been made to eliminate the above-mentioned problems, and an object of the invention is to provide a process of lowering a temperature necessary for crystallization and reducing a time therefor in a method of manufacturing a thin film formed of a crystalline silicon semiconductor by application of a method of crystallizing a thin film formed of an amorphous silicon by heating. The crystalline silicon semiconductor prepared by a process of the present invention has the physical properties not lower than those prepared by the conventional process, and applicable even to the active layer region of a TFT.

The inventors have conducted the following experiments in the above-mentioned method of forming an amorphous silicon semiconductor film by the CVD method or the sputtering method to crystallize the film thus formed by heating, and considered the experiment result.

First, the mechanism of forming the amorphous silicon film on a glass substrate to crystalize the film by heating has been investigated. As a result, it has been observed that the crystal growth started from an interface between the glass substrate and the amorphous silicon, then developed into the columnar shape perpendicular to the front surface of the substrate when it has the thickness of a certain degree.

It is considered that the above-mentioned phenomenon is caused by the fact that a crystalline nucleus forming a base of the crystal growth (the source forming a base of the crystal growth) exists in the interface between the glass substrate and the amorphous silicon film and the crystal grows from the nucleus. Such a crystalline nucleus is considered to be of a bit of impurity metallic element which exists on the surface of the substrate or the crystalline component of the glass surface (it is considered that the crystalline component of silicon oxide exists on the surface of the glass substrate as called the crystallized glass).

Therefore, it was considered that the temperature of crystallization can be lowered by more positively introducing the crystalline nucleus, and for the purpose of confirming this effect, a bit of other metals was formed on the substrate, and a thin film of the amorphous silicon was then formed thereon. Thereafter, the experiment of crystallization by heating was conducted. As a result, it was confirmed that, in the case of forming several metals on the substrate, the temperature of crystallization was lowered, and it was expected that there occurred crystal growth which had the foreign matter as the crystalline nucleus. Therefore, the mechanism of a plurality of impurity metals which could lower the temperature has been investigated in more detail.

The crystallization can be divided into two stages, that is, an initial nucleus creation and the crystal growth from the nucleus. The speed of the initial nucleus production was observed by measuring a time until fine crystals occurred in the dot pattern at a given temperature. That time was reduced in any cases of the thin films forming the above impurity metals, and the effect of lowering the temperature of crystallization when the crystalline nucleus was introduced was confirmed. Further, the growth of a crystal particle after nucleus production was investigated while changing the heating time. As a result, though this was beyond all expectations, it was observed that even the speed of crystal growth after the nucleus production was remarkably increased in the crystallization of the amorphous silicon thin film formed on the film of a certain metal. This is beyond all expectations. This mechanism will be described in more detail later.

In any case it was found that, as a result of the two effects mentioned above, when certain types of metals in trace amounts are used to form a film on which a thin film made of amorphous silicon is then formed and then heated for crystallization, sufficient crystallization is achieved at temperatures of 580° C. and below for a period of about 4 hours, a fact which could not be foreseen according to the prior art. Examples of metal impurities having such an effect include iron, cobalt, nickel, copper, palladium, silver and platinum. All of these metals are often used as catalyst materials, and thus hereunder in the present specification they will be referred to as "metal catalyst for low temperature crystallization". Of these, the metal with the most notable effect and the easiest material to handle is nickel, and thus hereunder in the present specification nickel will be used as the center of discussion.

As an example of the degree of the effect provided by nickel, when on an untreated substrate (Corning 7059), i.e. one on which no thin film of trace nickel had been formed, a thin film of amorphous silicon formed by the plasma CVD method was heated in a nitrogen atmosphere for crystallization, a heating temperature of 600° C. required a heating time of 10 hours or more. However, when an amorphous silicon thin film was used on a substrate on which had been formed a thin film of trace nickel, a similar crystalline state could be obtained with only about 4 hours of heating. Raman spectroscopy was used for the judgment of this crystallization. From this alone it is clear that the effect of nickel is exceptional.

As is clear from the above explanation, if an amorphous silicon thin film is formed on a thin film formed using a trace amount of a metal catalyst for low temperature crystallization, then it becomes possible to lower the crystallization temperature and shorten the time required for crystallization. Here, a more detailed explanation will be provided with the assumption that the process is used for the preparation of a TFT. The description will be more specific later, but the same effect is achieved not only when a thin film of a metal catalyst for low temperature crystallization is formed on the substrate, but also when it is formed on the amorphous silicon, and also with ion implantation, and therefore hereunder in the present specification all of these successive treatments will be called "addition of a trace amount of a metal catalyst for low temperature crystallization". As the metal catalyst for low temperature crystallization, it is useful to use at least one element selected from the group consisting of iron, cobalt, nickel, copper, palladium, silver and platinum, but based on our discovery the Group VIII elements Ru, Rh, Os and Ir may be mentioned as elements having the same effect as the above mentioned materials.

First an explanation will be given regarding a method of addition of the metal catalyst for low temperature crystallization. For the addition of a trace amount of the metal catalyst for low temperature crystallization, the same temperature lowering effect is provided either by a method of forming a thin film containing a trace amount of the metal catalyst for low temperature crystallization on a substrate and then forming thereon an amorphous silicon film; or by a method of first forming the amorphous silicon film and forming the thin film containing a trace amount of the metal catalyst for low temperature crystallization, and the formation of the films may be either by a sputtering method or a vapor deposition method, and thus the effect is accomplished regardless of the film-forming method.

However, if a thin film containing a trace amount of a metal catalyst for low temperature crystallization is formed on a substrate, then rather than directly forming on a 7059 glass substrate a thin film containing a trace amount of a metal catalyst for low temperature crystallization, the effect is more notable if a silicon oxide thin film is first formed on the substrate and the thin film containing a trace amount of a metal catalyst for low temperature crystallization is formed over it. One of the reasons that may be imagined for this is that direct contact between the silicon and the metal catalyst for low temperature crystallization is essential for the present low temperature crystallization, and it is thought that in the case of 7059 glass components other than silicon might interfere with the contact or reaction between the silicon and the metal.

Also, roughly the same effect was confirmed when the method used for the trace addition was not formation of a thin film by contact with the top or bottom of the amorphous silicon, but addition of the metal catalyst for low temperature crystallization by ion implantation. Furthermore, it may be added as an impurity at the time of formation of an amorphous silicon film or a non-single crystal silicon film to be crystallized.

Regarding the amount of the metal catalyst for low temperature crystallization, for example in the case of nickel a lower temperature was confirmed with addition of an amount of $1 \times 10^{15}$ atoms/cm$^3$ or more, but addition of amounts of $1 \times 10^{21}$ atoms/cm$^3$ or more resulted in peaks of Raman spectrum whose shape clearly differed in comparison with simple silicon, and therefore it is thought that the range for actual use is $1 \times 10^{15}$ atoms/cm$^3$–$5 \times 10^{19}$ atoms/cm$^3$. Further, considering that the film will be used as a semiconductor for an active layer of a TFT, this amount must be kept to within $1 \times 10^{15}$ atoms/cm$^3$–$2 \times 10^{19}$ atoms/cm$^3$.

An additional explanation will now be given regarding the assumed mechanism of crystallization when nickel is used as the metal catalyst for low temperature crystallization.

As described above, if no metal catalyst for low temperature crystallization is added, then nuclei are randomly generated from the crystal nuclei on the interface with the substrate, etc., and the crystal growth from these nuclei is likewise random, and it has been reported that relatively oriented crystals obtained in (110) or (111) are obtained depending on the method of preparation, and naturally crystal growth which is roughly uniform over the entire thin film is observed.

First, in order to determine the mechanism, an analysis was made with a DSC (differential scanning calorimeter).

An amorphous silicon thin film formed on a substrate by a plasma CVD was placed with the substrate in a sample container, and the temperature was raised at a constant rate. Distinct exothermic peaks were observed at about 700° C., and crystallization was observed. Naturally, this temperature shifted when the temperature-raising rate was changed, but when the rate was, for example, 10° C./min crystallization commenced at 700.9° C. Next, measurements were made with three different temperature-raising rates, and the activation energies of the crystal growth after the initial generation of nuclei were determined by the Ozawa method. This resulted in a value of about 3.04 eV. Also, when the reaction rate equation was determined by fitting with the theoretical curve, it was found to be most easily explainable by a model of disorderly generation of nuclei and growth therefrom, thus confirming the propriety of the model in which nuclei are generated randomly from crystal nuclei on the interface with the substrate, etc., and crystal growth occurs from these nuclei.

Measurements identical to those mentioned above were made with the addition of a metal catalyst for low temperature crystallization, with addition of a trace amount of nickel used as an example. This resulted in initiation of crystallization at 619.9° C. with a temperature-raising rate of 10° C./min, and the activation energy of the crystal growth determined by a series of these measurements was about 1.87 eV, thus showing numerically as well the readiness of the crystal growth. In addition, the reaction rate equation determined by fitting with the theoretical curve was closer to that of a linear interface rate-determined model, suggesting crystal growth with orientation in a constant direction.

Here, a lowering of the temperature for initiation of crystallization is readily assumed to be an effect of the foreign matter, as described previously, but questions are raised as to the cause of the simultaneous reduction in the activation energy of the crystal growth. In order to investigate the reason therefor, the above method was used to measure the activation energy of recrystallization of an amorphous silicon film prepared by implantation of silicon ions into a non-single crystal silicon film for amorphous state, with no crystallization. As a result, it was found that although crystallization initiation temperature shifted back to the high temperature end, the activation energy of the crystal growth was lowered to about 2.3 eV. Here, considering that almost no hydrogen was present in the amorphous silicon film subjected to the ion implantation, the readiness of the crystal growth may be understood to be rate-determined by the readiness of hydrogen to escape from the interface between the crystal sections and the amorphous sections. As an experimental result to support this hypothesis, the results of TG-DTA (simultaneous thermogravimetry-differential thermal analysis) of amorphous silicon films suggest the very high possibility that initiation of crystallization always occurs directly after pauses in the escape of hydrogen, and thus that the hydrogen impedes crystallization.

Here, a closer look at the reaction between hydrogen and the metal catalyst for low temperature crystallization which is added shows that when any of the candidate metals react with hydrogen to form hydrides, the reaction is exothermic (only palladium exhibits an endothermic reaction according to some documents). This suggests that the metal catalyst for low temperature crystallization is stabilized by bonding with hydrogen, and it is thought that the lowering in temperature is achieved by the following mechanism.

The metal catalyst for low temperature crystallization incorporated into the amorphous silicon forms a direct bond with the silicon. When heat is applied thereto, diffusion of the metal catalyst for low temperature crystallization precedes crystallization to a uniform concentration gradient, but while diffusing it also bonds to hydrogen, and this results in weaker bonds with the silicon which are easily breakable, thus increasing the number of dangling bonds and vacancy in the film. Crystallization necessitates the migration of the silicon atoms, and it is presumed that the increase in dangling bonds and vacancy facilitates this migration, meaning that the preparation for crystallization is made at a lower temperature. Generation of the nuclei occurs afterwards, but the activation energy at this time is reduced by the addition of a trace amount of the metal catalyst for low temperature crystallization. This obviously results from the fact that the addition of the metal catalyst for low temperature crystallization allows the generation of crystals at a lower temperature, and the reason for this is believed to be possibly the effect of the simple metal catalyst for low temperature crystallization as foreign matter or the effect of an alloy of the metal catalyst and silicon.

Also, the generation of the nuclei is almost simultaneous over the entire surface of the area to which the metal catalyst for low temperature crystallization has been added, and consequently the crystal growth follows the mechanism of growth as a surface, in which case the reaction rate equation becomes that of a linear interface rate-determination process and thus matches the results of DSC. The crystal growth from the crystal nuclei progresses afterwards, but since at this time hydrogen is not present at the interface between the crystal sections and the amorphous sections, the rate-determining process changes and the activation energy required for crystal growth is greatly lowered accordingly.

Diffusion of the metal catalyst for low temperature crystallization prior to crystallization is essential in order to explain the above mechanism, but this is assumed to be clear because, in cases of samples which were annealed up until the beginning of crystallization, measurement of the concentration of the metal catalyst for low temperature crystallization by SIMS (secondary ion mass spectrometry) confirmed the presence of the metal catalyst for low temperature crystallization at levels higher than the lower limit even in areas relatively far distant from the area to which the metal catalyst for low temperature crystallization had been directly added.

An additional explanation will now be provided in regard to the crystalline morphology of the crystalline silicon film obtained by the above mentioned addition of a trace amount of a temperature crystallization metal catalyst.

As was briefly mentioned in the explanation of the crystallization mechanism, the added metal has a fairly wide range of diffusion at temperatures below that of crystallization. Consequently, a lowering in the crystallization temperature is also achieved in these areas of diffusion. Furthermore, it has become clear that the morphology of the crystals differs between the area of direct addition and the areas of diffusion. That is, it has been confirmed that the area of direct addition exhibits crystal growth vertically to the substrate, while the surrounding areas of diffusion show growth horizontally to the substrate.

It is assumed that this was due to a difference in the initial generation of the nuclei in each case. That is, it may be interpreted that in the area of direct addition the foreign matter serves as the crystal nuclei to produce columnar crystal growth, while in the surrounding areas of diffusion the crystal nuclei must of necessity grow horizontally because of the vertical growth already initiated from the area of direct addition. Hereunder in the present specification such areas of crystal growth in a horizontal lateral direction on the substrate extending outward from the area of direct addition of the metal catalyst for low temperature crystallization will be referred to as "lateral growth" regions.

An explanation will now be given regarding the electrical properties of the sections of trace addition of nickel and of the surrounding lateral growth sections, for a case in which nickel is used as the above mentioned metal catalyst for low temperature crystallization. Regarding the electrical properties of the area of trace addition of nickel, the conductivity was about the same value as for a film with no nickel added, or a film heated for a few dozen hours at about 600° C. Also, when the activation energy was determined based on temperature dependence of the conductivity, no behavior seemingly due to the order of the amount of nickel was observed if the amount of nickel was about $10^{17}$ atoms/cm$^3$–$10^{18}$ atoms/cm$^3$ as mentioned above. In other words, the experimental facts lead to the supposition that within the above range of concentration the film may be used as the active layer of a TFT, etc.

In contrast, the lateral growth sections had a conductivity which was one order higher in comparison with the area of trace addition of nickel, and this is a high value for crystalline silicon semiconductors. This was thought to be due to the fact that, since the path direction of the current matched the lateral growth direction of the crystals, in the sections between the electrodes through which electrons pass the grain boundary was either small or virtually non-existent, and thus there was no contradiction with the results shown in the transmission electron micrographs. That is, it is conceivable that because the migration of the carrier occurred along the grain boundary of the needle-like- or columnar-growing crystals, a condition for easy migration of the carrier had been created.

In addition, as shown in FIG. 1, when nickel is selectively introduced as a nickel silicide film in the area indicated by 100, and then an amorphous silicon film 104 is formed thereon by the publicly known plasma CVD method and crystallization is induced by heating at 550° C. for 4 hours, crystal growth occurs in the nickel-introduced area 100 in a vertical direction to the substrate 101, while in the areas other than 100 horizontal growth occurs parallel to the substrate 101 as shown by the arrows 105. A crystalline silicon film is obtained as a result. When the nickel concentration of such a crystalline silicon film was measured by SIMS, the following discoveries were made.

1. The concentration distribution of the nickel is not so large in the perpendicular thickness direction of the film.

2. The concentration of nickel in the area of direct introduction of the nickel (for example, the area 100 in FIG. 1) is greatly influenced by the conditions of forming the nickel film. In other words, the nickel concentration in that area does not provide very much reproducibility.

3. In the areas with crystal growth parallel to the substrate (areas where nickel had not been directly introduced), the concentration of nickel is about one order or more lower than in the area in which nickel is directly introduced, in 2 above, and the concentration therein is highly reappearing.

4. The background nickel concentration is about $1 \times 10^{17}$ cm$^{-3}$, which roughly matches the limit of measurement by SIMS. That is, the background nickel concentration is at or lower than about $1 \times 10^{17}$ cm$^{-3}$, the measurable limit of SIMS.

Figure 4:
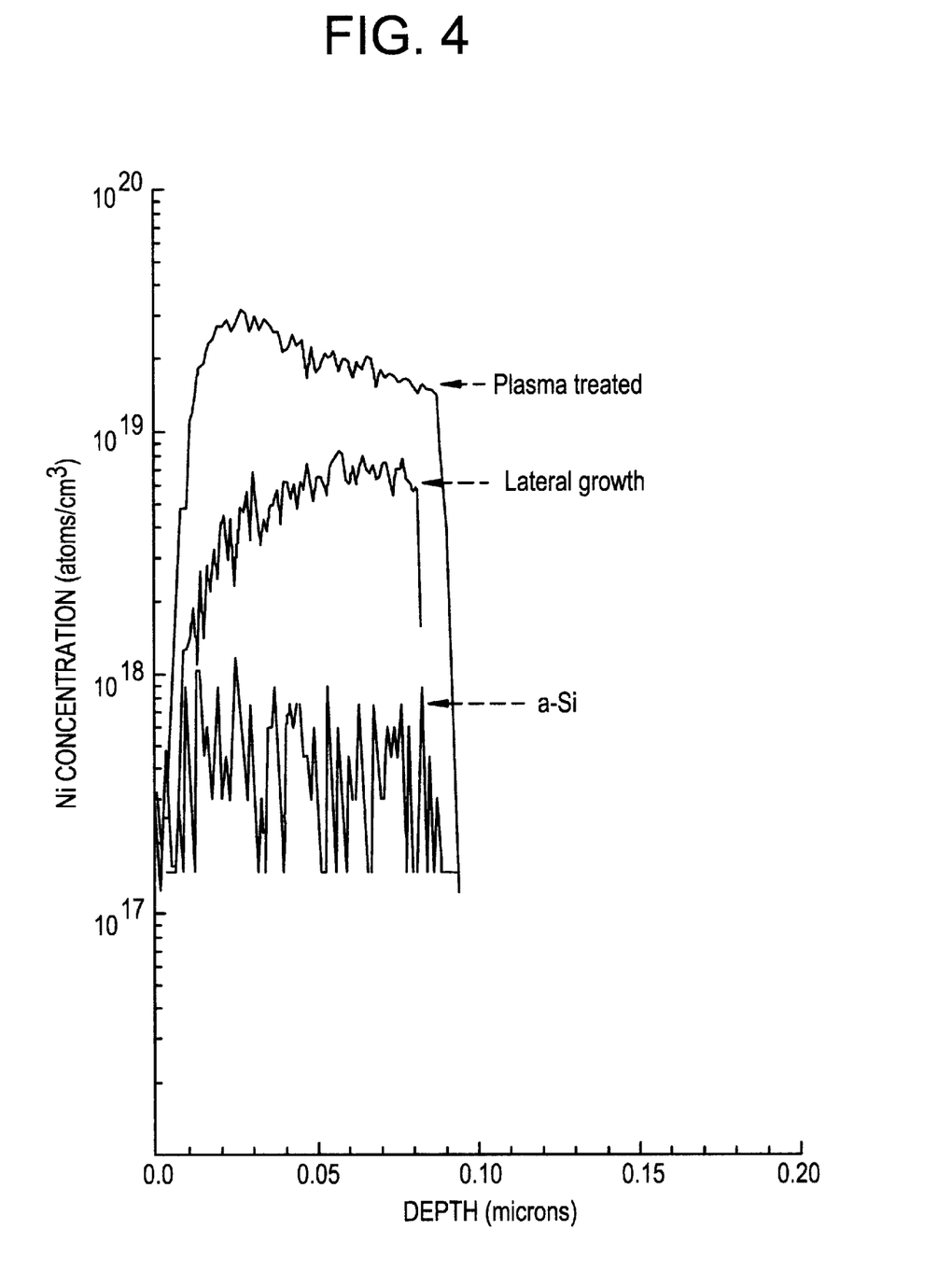
FIG. 4 shows the density of a metal element in a crystalline silicon film.

For example, in the area in which nickel is directly introduced and crystal growth occurred vertically with respect to the substrate, if nickel is present at a concentration of about $2 \times 10^{18}$ cm$^{-3}$ then the measured nickel concentration will be about one order lower, or about $2 \times 10^{17}$, in the areas about 40 μm distant from the nickel-introduced area, in which crystal growth occurred parallel to the substrate, i.e. the areas where lateral growth occurred. The above case will be explained with reference to FIG. 4. FIG. 4 shows the Ni concentration of an area to which Ni was added by plasma treatment (Plasma treated), the Ni concentration of the areas which experienced crystal growth parallel to the substrate (Lateral growth), and the ground level Ni concentration of a-Si. As is clear from FIG. 4, the Ni concentration of the areas which experienced crystal growth parallel to the substrate (Lateral growth) was lower than in the area in which Ni had been directly introduced. Consequently, the areas in which crystal growth occurred parallel to the substrate are more useful for a device.

Since it is very difficult to control the nickel concentration in the silicon film at the area of direct nickel introduction, this nickel concentration fluctuates greatly depending on the conditions of the formation of the nickel film (actually a nickel silicide film). It is thought that this is due to the fact that the nickel concentration in this area (for example, area 100 in FIG. 1) is directly dependent on the film-forming conditions required for severely thin film thicknesses on the order of 20 Å (because the actual measurement is difficult, this value is deduced from the film-forming rate). As is well known, it is impossible to form satisfactorily uniform films of around 20 Å over large surface areas using film-formation methods such as a sputtering method. Consequently, it is believed that the poor reproducibility of the forming of the film directly reflects the fluctuation of the nickel concentration in the silicon film. Furthermore, the variations in the nickel concentration also directly affects the properties of a TFT formed using this area in which nickel was directly introduced as the active layer. That is, if a TFT is prepared using this area in which nickel was directly introduced (for example, 100 in FIG. 1), then wide variations will occur in the properties thereof. This is also thought to be a result of the poor reproducibility of the exceedingly thin nickel film.

On the other hand, the nickel concentration in the areas distant from the nickel-introduced area, that is, the areas in which crystal growth from the direct nickel-introduced area occurred horizontally in a direction parallel to the substrate, was generally lower than in the direct nickel-introduced area (as mentioned above, about one order less in sections 40 μm distant), and further a tendency was seen toward smaller variation in that concentration. It is known from experiments that the nickel concentration for an active layer with properties satisfactory for a TFT is from the measuring limit of SIMS or lower ($1 \times 10^{17}$ cm$^{-3}$ or lower) to about $2 \times 10^{19}$ cm$^{-3}$, but in the areas of parallel crystal growth with respect to the substrate, the above given nickel concentrations have been found to be relatively stable regardless of the amount of nickel directly introduced (the nickel concentration of the silicon film 104 in the nickel-introduced area, for example, area 100) In other words, if a TFT is formed using the areas in which crystal growth from the nickel-introduced area occurs parallel to the substrate, then it is possible to obtain a TFT with very good reproducibility.

Furthermore, it has been found to be very easy to select areas with nickel concentrations in the above range, or to adjust the nickel concentrations of certain areas (though not the area indicated by 100 in which nickel has been directly introduced) within the above range. For example, for the selection of areas having specific nickel concentrations, a specific nickel concentration may be attained by setting the distance from the nickel-introduced area. However, in this case the required crystallinity of the silicon film must be obtained.

Also, the nickel concentration in the areas of crystal growth parallel to the substrate may be controlled by controlling the conditions of crystallization (mainly the heating time and heating temperature), and this control is much easier than control of the nickel concentration in the area in which nickel has been directly introduced.

Thus, the areas of crystal growth parallel to the substrate, from the area to which the catalyst element has been added for crystallization, that is, the areas of the lateral growth, are useful for employment in semiconductor devices because (1) the orientation of the crystals may be positively used, and the carrier with a high degree of mobility may be used;
(2) the areas of low concentration of the catalyst material for crystallization may be used;
(3) the areas in (2) above have good reproducibility; and
(4) it is possible to easily control the concentration of the catalyst material for crystallization.

Finally, an explanation will be given regarding methods of applying the various properties mentioned above to a TFT. Here, the field of application of the TFT is assumed to be an active matrix-type liquid crystal display which uses the TFT as a driver for a picture element.

As described previously, it is important to minimize the shrinkage of the glass substrates in recent large-screen active matrix-type liquid crystal displays, and by using the process of adding a trace amount of a metal catalyst for low temperature crystallization according to the present invention the crystallization is possible at a sufficiently low temperature compared to the distortion point of glass, and thus it is a particularly suitable method. By following the present invention, the section using conventional amorphous silicon may easily be replaced by crystalline silicon by adding a trace amount of a metal catalyst for low temperature crystallization thereto and conducting crystallization at about 500–550° C. for about 4 hours. Obviously, some variations will be required to adapt to specific rules of design, etc., but the present invention may be carried out satisfactorily with the devices and the processes of the prior art, and thus its advantages are thought to be considerable.

Furthermore, according to the present invention, TFTs used in picture elements and TFTs which make up the drivers of peripheral circuits may be made as separate types by employing crystal morphology adapted to their respective desired properties, and they offer particular advantages when applied to active-type liquid crystal displays. TFTs used in picture elements do not demand so much mobility, and instead their major advantage is a low off-state current. Here, when employing the present invention, a trace amount of a metal catalyst for low temperature crystallization may be directly added to the area which is to become the TFT for a picture element, to cause vertical growth of crystals, and to form a number of grain boundaries with respect to a channel direction resulting in a lower off-state current. In contrast, a TFT which is to form the driver of a peripheral circuit requires a very high degree of mobility if its future application in a workstation or the like is being considered. Here, if the present invention is applied, trace amounts of a metal catalyst for low temperature crystallization are added near the TFT which is to form the driver of the peripheral circuit, and from there growth of crystals is caused in a single direction (parallel to the substrate), and by aligning the direction of the crystal growth with the path direction of the channel current, it is possible to produce a TFT with a very high degree of mobility.

Furthermore, there are known devices comprising a glass substrate on which are integrated sensors for handling picture information or optical signals. For example, integrated image sensors and the like are known. Such devices, if they are to be used for the detection of visible light, preferably use amorphous silicon (a-Si) from the point of view of spectral sensitivity. However, since driving circuit sections must have switching elements for which high-speed operation is demanded, the element of a driving circuit section, for example the TFT, is preferably not made of an amorphous silicon film because of its insufficient mobility. However, it is useful to use the above mentioned high-mobility TFT. For example, a photo diode or photo transistor employing an amorphous silicon film is formed in the sensor section, and the peripheral circuit sections form transistors using the crystalline silicon film according to the present invention. These circuits may also be integrated on the same substrate (for example, a glass substrate) with composite structures.

In other words, by employing the present invention, it is possible to create areas with crystalline silicon films and areas with amorphous silicon films in prescribed areas, and by using the areas with crystalline silicon films in which crystal growth has occurred laterally, it is possible to form a device in which the carrier may migrate at a high speed. This utility is not limited to liquid crystal displays and sensors, and may be applied to a wide variety of semiconductor devices integrated onto substrates. That is, it may be used in transistors and diodes which employ thin-film semiconductors on substrates, as well as devices containing integrated resistors and capacitors.

By construction of an active layer of a TFT or the like by growing crystals in a needle-like or columnar manner parallel with respect to a substrate from an area into which has been introduced a trace element selected mainly from the Group VIII elements which have catalytic effects for crystallization of silicon, it is possible to use as the active layer the areas with lower concentrations of the trace element than the area into which it has been introduced, and thus it is possible to obtain a device which is not affected by the above mentioned trace element.

Furthermore, during the formation of the device, the carrier flow may be set to be aligned with the direction of the crystal growth of the crystalline silicon film in a needle-like or columnar manner, in order to improve the properties of the device. In addition, since the concentration of the above mentioned trace element in these areas is either low or may be easily controlled, it is possible to obtain a device with the necessary properties and with good reproducibility.

BRIEF DESCRIPTION OF THE DRAWINGS

The accompanying drawings, which are incorporated in and constitute a part of this specification, illustrate embodiments of the invention, and together with the description, serve to explain the objects, advantages and principles of the invention. In the drawings.

DETAILED DESCRIPTION OF THE PREFERRED EMBODIMENTS

Embodiments of the present invention will be described with reference to the accompanying drawings.

In the following Examples, cases are given in which nickel is used as the catalyst for crystallization, but other Group VIII elements, as well as Cu and Ag which are expected to have the same effect as nickel, may basically be used in place of nickel in the Examples. Furthermore, the method of introduction may be one in which the element or a film containing the element is used to form a film on the top surface of a non-single crystal silicon film, one in which the Group VIII element is added to a non-single crystal silicon film by ion doping or ion implantation, or one in which it is mixed with an amorphous silicon film at the time it is formed. Here, its concentration in the silicon film should be $2 \times 10^{19}$ cm$^{-3}$ or less.

EXAMPLE 1

This Example is a case of forming a complementary integrated circuit including a P-channel type TFT (called a PTFT) and a N-channel type TFT (called an NTFT) each made using a crystalline silicon film on a glass substrate. The construction of this Example may be used in a switching element for a picture element electrode, a peripheral driver circuit, or an image sensor or other integrated circuit of an active-type liquid crystal display.

A cross-sectional view showing the steps of preparation for the Examples is given in FIGS. 1A–1D. First, an underlying film 102 of silicon dioxide is formed on a substrate (Corning 7059) 101 to a thickness of 2000 Å by the sputtering method. Next, a mask 103 is provided which is a metal mask, or a silicon dioxide film or the like. This mask 103 provides a slit-shaped exposure of the underlying film 102 at the area indicated by 100. That is, when FIG. 1 (A) is viewed from the top, the underlying film 102 is exposed with a slit shape, while the other sections thereof are masked.

Figure 1A:
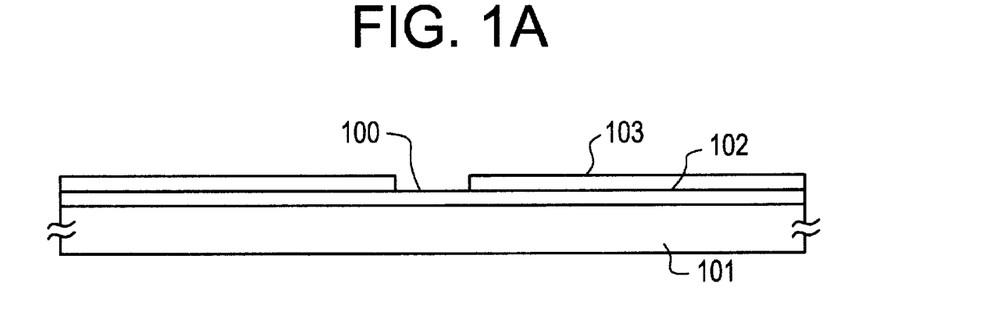
FIGS. 1A to 1D show a process of manufacturing a semiconductor device in accordance with the present invention.
Figure 1B:
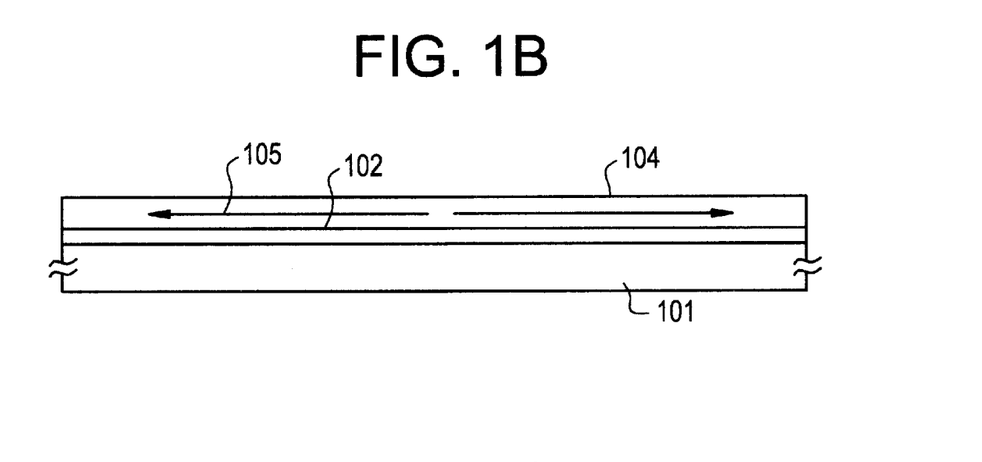
Figure 1C:
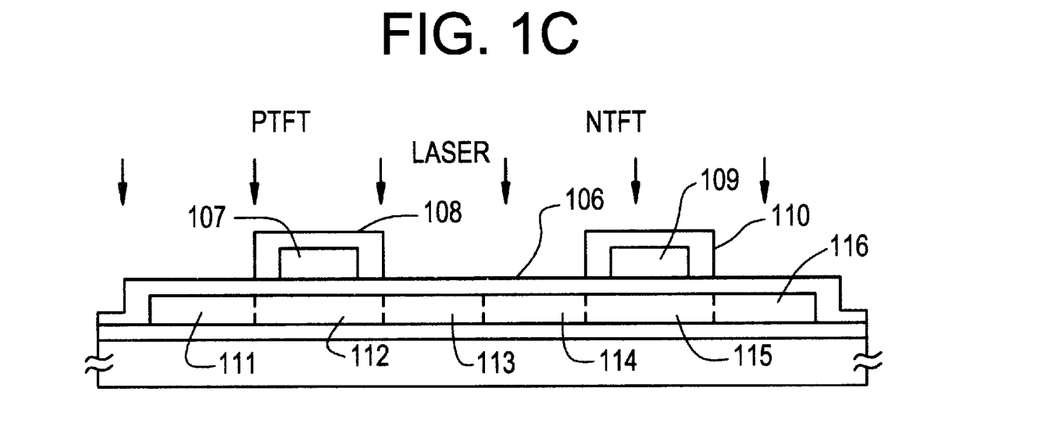

After the above mask 103 is provided, a nickel silicide film (chemical formula: NiSi$_x$, where $0.4 \leq x \leq 2.5$, e.g., $x=2.0$) is selectively formed on the area 100 by the sputtering method to a thickness of 5–200 Å, for example, 20 Å. This nickel silicide film is formed in order to use nickel or another Group VIII element as the catalytic element for crystallization.

Next, an intrinsic (type I) amorphous silicon film 104 of thickness 500–1500 Å, for example 1000 Å, is formed by the plasma CVD method. This is then crystallized by annealing for 4 hours in a hydrogen reducing atmosphere (preferably at a hydrogen partial pressure of 0.1–1 atmospheres) at 550° C. or an inert atmosphere (at atmospheric pressure) at 550° C. Here, in the area 100 on which the nickel silicide film is selectively formed, crystallization of the crystalline silicon film 104 occurs vertically with respect to the substrate 101. Also, in the areas other than the area 100, as shown by the arrow 105, crystal growth occurs horizontally from the area 100 (parallel to the substrate).

Further, to facilitate the crystal growth and obtain a more dense crystalline silicon film, the above mentioned thermal annealing is followed by annealing with lamp heating. This annealing is performed using 1.2 μm infrared light, and the annealing time is not more than 5 minutes. Infrared light is efficiently absorbed by silicon, and thus a considerable effect of improving the quality of the silicon film may be achieved. On the other hand, since it is not easily absorbed by the glass substrate, a significant effect is obtained in that energy is provided selectively to the silicon while little heat is received by the glass substrate. The light used for annealing by lamp heating may be tungsten halogen light (wavelength: 0.5 μm–3.5 μm) or the like. This annealing by lamp heating makes it possible to obtain a dense crystalline silicon film. In addition, it is also possible to perform the annealing using laser light instead of the above lamp heating.

Furthermore, when N-channel type TFTs were made with the above lamp heating-annealed crystalline silicon film and a crystalline silicon film formed without the above lamp heating, respectively, and the mobility of each measured, an improvement of about 20% on the average was observed. This is thought to be due to the improved crystallinity by the lamp heating, and particularly the large reduction in defects in the film.

As a result of the above mentioned steps, it is possible to obtain a crystalline silicon film 104 by crystallization of an amorphous silicon film. The elements are then separated to determine the areas of the active layers of the TFT in which there are formed source/drain regions and a channel-forming region. In this Example there was observed crystal growth in a direction parallel to the substrate (horizontal growth) covering about 40 μm or more, and therefore the lengths of each of the active layers (lengths of the source/drain directions) were 40 μm. In this case, the distance between the center of the channel and the site of nickel introduction is about 20 μm, but by adjusting this distance, it is possible to select the desired nickel concentration in the active layer (particularly in the channel-forming area).

Next, a silicon oxide film 106 is formed by a sputtering method to a thickness of 1000 Å as a gate insulation film. In the sputtering method, silicon oxide is used as the target and the temperature of the substrate during the sputtering is 200–400° C., for example 350° C., the atmosphere for sputtering comprises oxygen and argon, and the argon/oxygen ratio is 0-0.5, for example 0.1 or less.

After these steps, annealing is repeated by lamp heating as in the preceding step. This is done in order to improve the properties of the interface between the gate insulation film 106 composed of silicon dioxide and the crystalline silicon film 104. Obviously, the crystallinity of the crystalline silicon film 104 may be further improved by this lamp heat-annealing. As is well-known, it is important to improve the properties of the interface between the gate insulation film and the channel-forming area in an insulation-type field effect transistor (in FIG. 1, 112 and 115 are the crystalline silicon film sections which become the channel-forming area), and more concretely to accomplish extreme minimization of defects and levels in those areas. Consequently, the lamp-heat annealing performed after the formation of the gate insulation film 106 provides a considerable effect. Also, the annealing may be performed by irradiation with laser light instead of lamp heating.

Next, a film of aluminum (containing 0.1–2% silicon) is formed by the sputtering method, to a thickness of 6000–8000 Å, for example 6000 Å. Also, patterning is performed to form gate electrodes 107, 109 on their surfaces. Then, the surfaces of these aluminum electrodes are subjected to anodization to form oxide layers 108, 110. This anodization was performed in an ethylene glycol solution which contained 1–5% tartaric acid. The thickness of each of the resulting oxide layers 108, 110 was 2000 Å. In the following ion doping step, these oxide layers 108 and 110 become thick enough to form offset gate areas, and thus the lengths of the offset gate areas may be determined in the above anodization step. Obviously, these gate electrodes may comprise silicon, or they may contain metal silicides, they may consist mainly of metal, or they may have a layered structure of silicon and metal.

Next, impurities are added by an ion doping method (ion implantation method) to impart one conductivity type to the active layer areas (making up the source/drain and the channel). In this doping step, impurities (phosphorus and boron) are implanted with the gate electrode 107 and its surrounding oxide layer 108 and the gate electrode 109 and its surrounding oxide layer 110 used as masks. The doping gas used is phosphine ($PH_3$) or diborane ($B_2H_6$), and in the former case the acceleration voltage is 60–90 kV, for example 80 kV, and in the latter case it is 40–80 kV, for example 65 kV. The dose is $1\times10^{15}$–$8\times10^{15}$ $cm^{-2}$, for example $2\times10^{15}$ $cm^{-2}$ of phosphorus and $5\times10^{15}$ $cm^{-2}$ of boron. During the doping, each of the elements is selectively doped by covering the other area with photoresist. As a result, N-type impurity regions 114 and 116 are formed, and P-type impurity regions 111 and 113 are formed, and thus it is possible to form P-channel type TFT (PTFT) areas and N-channel type TFT (NTFT) areas.

Then, annealing is performed by irradiation with laser light. The laser light used was from a KrF excimer laser (wavelength 248 nm, pulse width 20 nsec), but other lasers may be used. The conditions of the laser light irradiation are an energy density of 200–400 $mJ/cm^2$, for example 250 $mJ/cm^2$, and irradiation with 2–10 shots, for example 2 shots per location. It is useful to heat the substrate to about 200–450° C. at the time of laser irradiation. Since in this laser annealing process nickel is dispersed in the previously crystallized areas, the laser light irradiation readily promotes recrystallization, and the impurity areas 111 and 113 doped with P-type-imparting impurities and the impurity areas 114 and 116 doped with N-type-imparting impurities may be easily activated.

An effective method of annealing the source/drain regions is annealing by the above mentioned lamp heating. As mentioned previously, this lamp heating (for example, 1.2 $\mu m$ infrared light is used) selectively heats silicon, and therefore it is useful for processes such as in the present Example, in which the heating of the glass substrate is to be avoided at all costs.

Figure 1D:
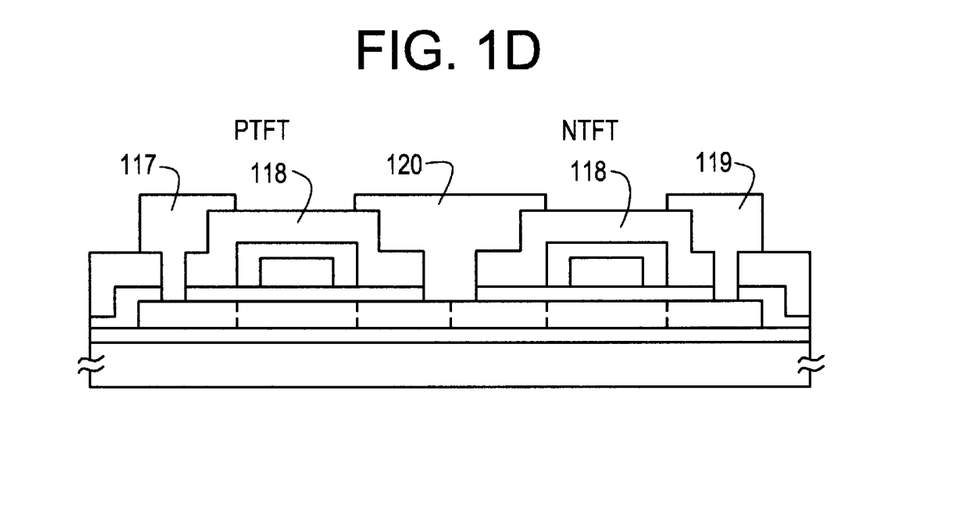

Next, a silicon oxide film 118 of thickness 6000 Å is formed by the plasma CVD method as an interlayer insulator, contact holes are formed therein, and TFT electrodes/wiring 117, 120 are formed by a multi-layered film of a metallic material, for example, titanium nitride and aluminum. Finally, annealing is performed at 350° C. for 30 minutes in a hydrogen atmosphere at 1 atmospheric pressure, to complete the semiconductor circuit constructed with a complementary TFT (FIG. 1 (D)).

The circuit described above has a CMOS structure with the PTFT and NTFT provided in a complementary manner, but in the above process two TFTs may be simultaneously constructed and separated to simultaneously prepare two separate TFTS.

Figure 2:
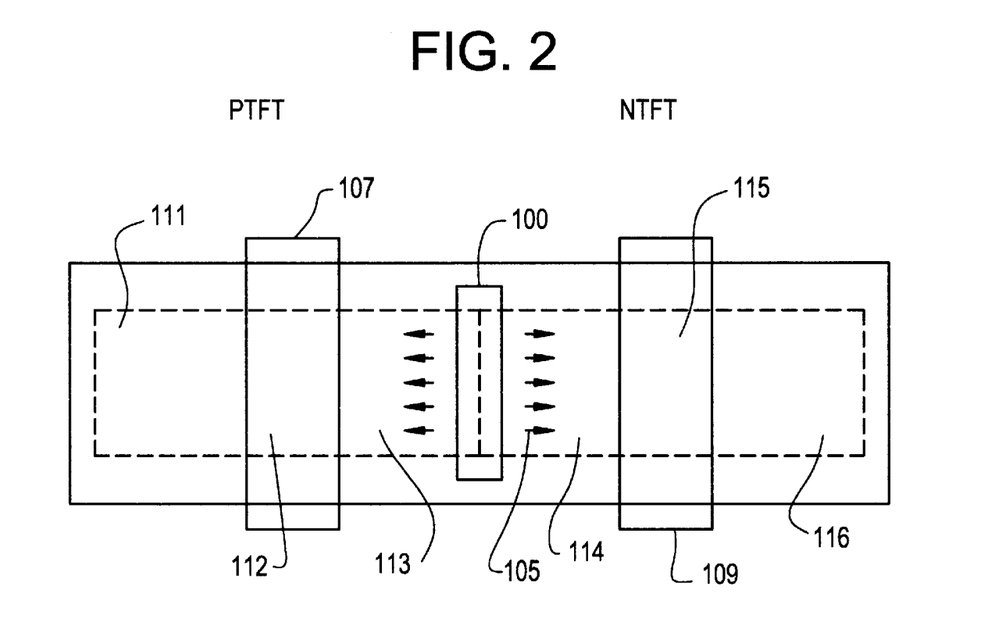
FIG. 2 shows an outline of the semiconductor device according to the invention.

FIG. 2 shows an outline as seen from the top of FIG. 1 (D). The symbols in FIG. 2 correspond to those in FIG. 1. As shown in FIG. 2, the direction of crystallization is in the direction shown by the arrow 105, and crystal growth occurs in the direction of the source/drain regions (direction of a line between the source region and the drain region). During operation of a TFT with this construction, the carrier migrates along the crystals which have grown in a needle-like or columnar manner between the source and the drain. That is, the carrier migrates along the crystalline grain boundary of the needle-like or columnar crystals. Consequently, it is possible to lower the resistance undergone when the carrier migrates, and obtain a TFT with a high degree of mobility.

In this Example, the method employed to introduce the nickel was one in which nickel was used to selectively form a nickel silicide film on the underlying film 102 under the amorphous silicon film 104 (since the film is very thin, it is not easily discernible as a film), and crystal growth was induced from that section, but the method may also be one in which a nickel silicide film is selectively formed after formation of the amorphous silicon film 104. That is, the crystal growth may be induced from either the top surface or the bottom of the amorphous silicon film. Furthermore, the method employed to introduce the nickel may also be one in which a nickel-containing electrode is used for plasma treatment to deposit a trace amount of nickel. Another method which may be employed is one in which an amorphous silicon film is formed in advance, and ion doping or ion implantation is used to selectively implant nickel ion in the amorphous silicon film 104. This method is characterized in that the concentration of the elemental nickel may be controlled.

EXAMPLE 2

This Example is a case of an active-type liquid crystal display provided with N channel-type TFTs as switching elements in each of the picture elements. The following is an explanation regarding a single picture element, but a plurality (usually several hundreds of thousands) of other picture elements are formed with the same construction. Also, it need not be mentioned that a P channel-type rather than an N channel-type may be used. Furthermore, it may be used in the peripheral circuit section instead of the picture element section of the liquid crystal display. It may also be employed in an image sensor or any other type of integrated circuit. In other words, there is no particularly restriction on its use so long as it is used as a thin-film transistor.

An outline of the preparation steps for this Example is shown in FIGS. 3A–3D. In this Example a Corning 7059 glass plate (thickness 1.1 mm, 300×400 mm) was used as the glass substrate 201. First, an underlying film 203 (silicon oxide) is formed to a thickness of 2000 Å by the sputtering method. Then, for selective introduction of nickel, a mask 203 is formed by a metal mask, a silicon oxide film, photoresist, or the like. Then, a nickel silicide film is formed by a sputtering method. This nickel silicide film is formed to a thickness of 5–200 Å, for example 20 Å. The nickel silicide film has a chemical formula of $NiSi_x$, where $0.4 \leq x \leq 2.5$, for example x=2.0. Thus there is selectively formed a nickel silicide film over the area of 204.

An amorphous silicon film 205 is then formed to a thickness of 1000 Å by the LPCVD method or the plasma CVD method, and dehydrogenated at 400° Cc for one hour, after which it is crystallized by thermal annealing. The annealing process was conducted at 550° C. for 4 hours in a hydrogen reducing atmosphere (preferably with a hydrogen partial pressure of 0.1–1 atmosphere). The thermal annealing process may also be carried out in an inert atmosphere of nitrogen or the like.

Figure 3A:
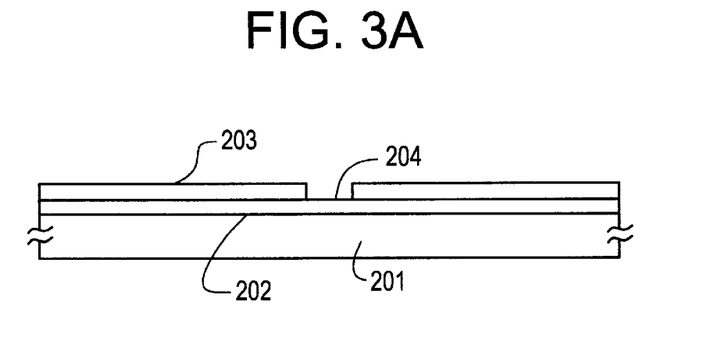
FIGS. 3A to 3D show a process of manufacturing a semiconductor device according to the invention.
Figure 3B:
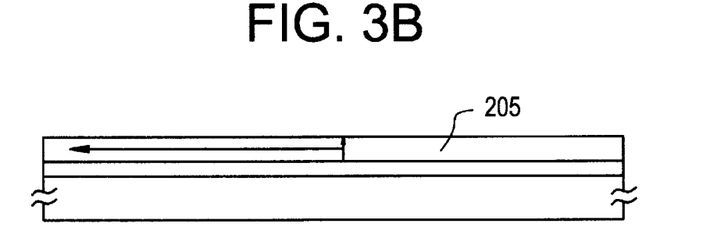
Figure 3C:
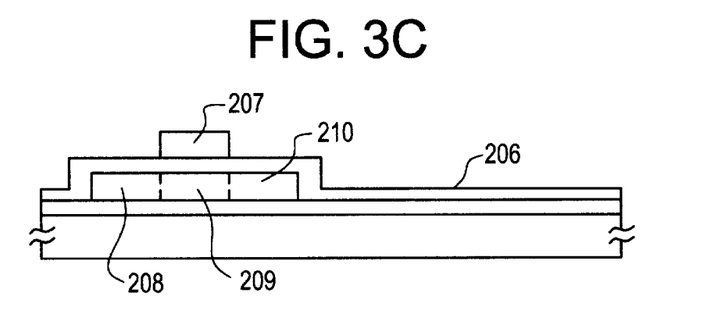
Figure 3D:
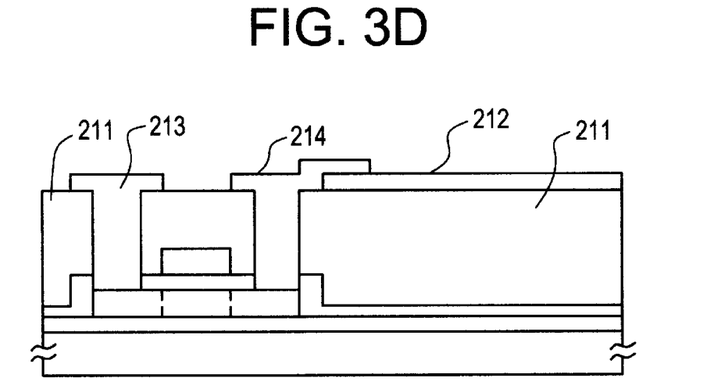

In this annealing process, since a nickel silicide film has been formed on part of the area (area 204) under the amorphous silicon film 205, crystallization starts at this part. During the crystallization, as shown by the arrow in FIG. 3 (B), crystal growth of the silicon progresses in a direction vertical to the substrate 201 at the section 204 where the nickel silicide film has been formed. In addition, as also shown by another arrow, in the areas on which the nickel silicide film has not been formed (the areas other than area 204), crystal growth occurs in parallel with respect to the substrate. Annealing is then performed by lamp heating in the same manner as Example 1 to improve (densify) the crystallinity of the silicon film.

In this manner it is possible to obtain a semiconductor film 205 comprising crystalline silicon. Next, the above mentioned semiconductor film 205 is patterned into a semiconductor island as a TFT forming area including source, drain and channel regions. Here, the distance between the section forming the channel-forming region 209 and the area in which nickel has been introduced 204 may be selected to determine the concentration of nickel in the channel-forming region 209. That is, the distance may be lengthened for a smaller concentration of nickel in the channel-forming area 209, and the distance may be shortened for a larger concentration of nickel in the channel-forming region. Naturally in this case, the silicon film 205 must be the crystallized area.

Also, silicon oxide gate insulation film (thickness: 700–1200 Å, typically 1000 Å) 206 is formed by the plasma CVD method in an oxygen atmosphere, using tetraethoxysilane (TEOS) as the starting material. The temperature of the substrate is set to 400° C. or lower, and preferably 200–340° C., to prevent shrinkage and warpage of the glass. Then, lamp heating with infrared radiation is effected for 1–5 minutes in the same manner as in Example 1, to improve the properties of the interface between the semiconductor film 205 and the gate insulation film 206.

Next, a publicly known film consisting mainly of silicon is formed by the CVD method, and it is patterned to form a gate electrode 207. It is then doped with phosphorus by ion implantation as an N-type impurity, and a source region 208, channel-forming region 209 and drain region 210 are formed in a self-aligning manner. Then it is irradiated with KrF laser light to improve the crystallinity of the silicon film whose crystallinity had been impaired by the ion implantation. Here the energy density of the laser light is 250–300 mJ/cm$^2$. As a result of this laser irradiation, the sheet resistance of the source/drain of this TFT is 300–800 Ω/cm$^2$. In this process as well, infrared lamp heating may be substituted for the laser light.

Next, an interlayer insulator 211 is formed with silicon dioxide, and a picture element electrode 212 is formed with ITO. In addition, contact holes are formed therein, electrodes 213, 214 are formed on the source/drain regions of the TFT using a chrome/aluminum multi-layer film, and one of the electrodes 213 is also connected to the ITO 212. Finally, annealing is performed in hydrogen at 200–300° C. for 2 hours to complete the hydrogenation of the silicon. Thus, the TFT is completed. This process is carried out simultaneously for the other picture element areas.

The TFT prepared in this Example uses a crystalline silicon film in which crystal growth has occurred in the direction of flow of the carrier, as the active layer making up the source region, channel-forming region and drain region, and thus since the carrier migrates along the crystal grain boundary of the needle-like or columnar crystals, without intersecting the crystal grain boundary, the TFT obtained has a carrier with a high degree of mobility. The TFT prepared in this Example was an N channel-type, and its degree of mobility was 90–130 (cm$^2$/Vs). Considering that the mobility of N channel-type TFTs using crystalline silicon obtained by crystallization with conventional thermal annealing at 600° C. for 48 hours has been 80–100 (cm$^2$/Vs), the improvement in the properties is notable.

Also, the degree of mobility of a P channel-type TFT prepared by a method similar to the above process was measured and found to be 80–120 (cm$^2$/Vs). This is also a notable improvement in the properties, considering that the mobility of P channel-type TFTs using crystalline silicon obtained by crystallization with conventional thermal annealing at 600° C. for 48 hours has been 30–60 (cm$^2$/Vs).

Figure 5A:
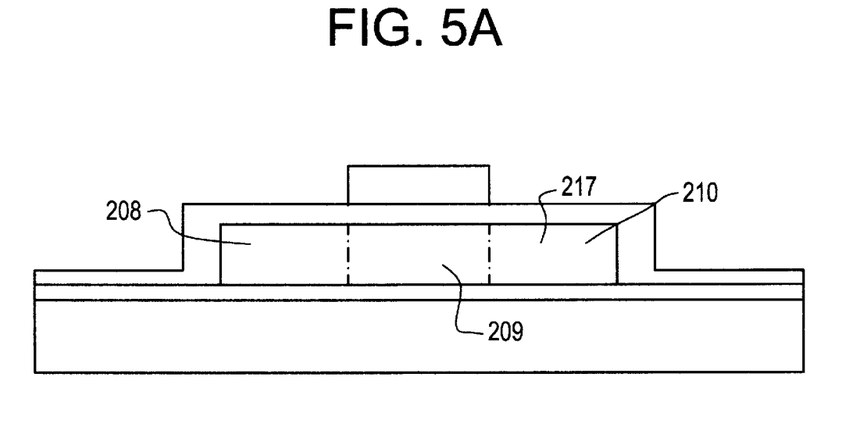
FIG. 5A shows a schematic cross-sectional view of a thin film type insulated gate field effect transistor of the present invention.
Figure 5B:
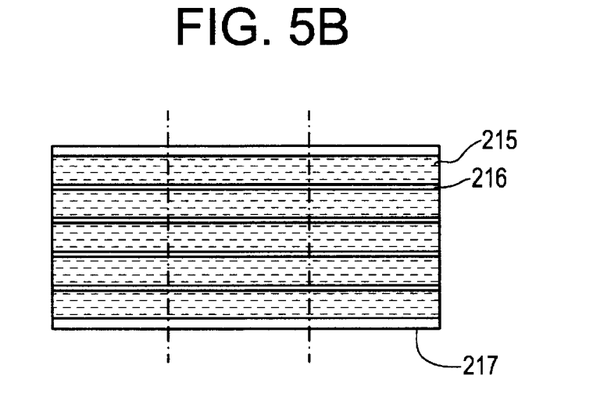
FIGS. 5B and 5C show a relation between a crystal growth direction and a source-drain direction in accordance with the embodiments of the invention.

FIGS. 5A and 5B illustrate the foregoing configuration. Namely, FIG. 5A is a schematic cross-sectional diagram of a TFT and FIG. 5B is a schematic plane view of the semiconductor island 217 having source, drain and channel regions therein. In particular, FIG. 5B illustrates the relation between the crystal growth direction and the source-drain direction along which a channel current flows. The reference numeral 215 shows each silicon crystals extending laterally in one direction. The reference numeral 216 shows grain boundaries between crystals. As can been seen, the source, drain and channel regions are so arranged that the source-drain direction is substantially in conformity with the direction in which the silicon crystals uniformly extends. Accordingly, the grain boundaries 216 do not have an adverse effect on the current passing through the channel region.

EXAMPLE 3

This is a modification of the TFT in Example 2 which is provided with a source/drain in a perpendicular direction with respect to the direction of crystal growth. That is, it is a case with a construction in which the direction of migration of the carrier is perpendicular to the direction of crystal growth, and thus the migration of the carrier intersects the crystal grain boundary of the needle-like or columnar crystals. With this type of construction, the resistance between the source and the drain may be increased.

This is because the carrier must migrate so that it intersects the crystal grain boundary of the needle-like or columnar crystals.

Figure 5C:
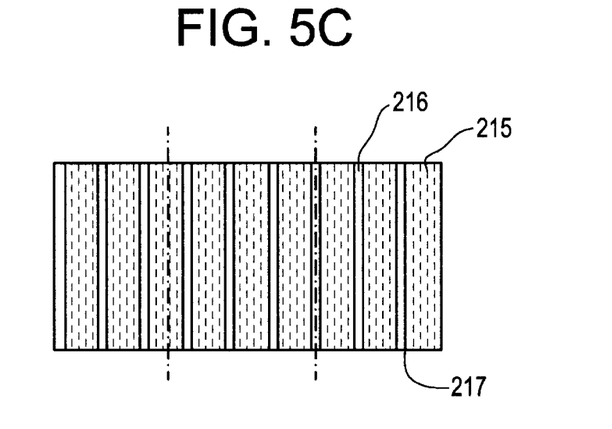

FIG. 5C shows a schematic diagram illustrating this condition. Namely, FIG. 5C shows a plane view of the semiconductor island 217 having source, drain and channel regions therein. The direction between source and drain regions is arranged in such a manner that a number of silicon crystals extends in a direction perpendicular to the source-drain direction. The reference numeral 216 designates the grain boundaries. It should be noted that FIGS. 5B and 5C are just for illustrating the relation between the crystal growth direction and the source-drain direction and does not intend to show the actual size or shape of the crystals.

To achieve the construction of this Example, it is only necessary to determine the orientation of the TFT in the construction in Example 2.

EXAMPLE 4

The main aspect of this Example lies in the fact that the orientation of the TFT in the construction in Example 2 (Here, the orientation is defined by the connecting line between the source/drain regions. That is, the direction of the TFT is determined by the orientation of the carrier flow.) is set at a desired angle with the direction of crystal growth of the crystalline silicon film with respect to the surface of the substrate, for selection of the properties of the TFT.

As described above, if the carrier is allowed to migrate in the direction of the crystal growth, the degree of mobility thereof will be improved. On the other hand, if the carrier is allowed to migrate perpendicularly with respect to the direction of the crystal growth, then the carrier must intersect multiple grain boundaries, and thus the degree of mobility of the carrier will be reduced.

Here, through appropriate selection between these two conditions, that is, by setting the angle between the direction of migration of the carrier and the direction of crystal growth within a range of 0–90°, it is possible to control the mobility of the carrier. Viewed differently, by setting the above angle between the direction of migration of the carrier and the direction of crystal growth, it becomes possible to control the resistance between the source and drain regions. Naturally, this construction may also be used for the construction in Example 1. In that case, the slit-shaped area 100 of trace addition of nickel shown in FIG. 2 is rotated within a range of 0–90° for selection within 0–90° of the angle between the direction of crystal growth shown by the arrow 105 and the line connecting the source and drain areas. Also, this angle may be set to near 0° to increase the mobility for a construction with a low degree of electrical resistance between the source and drain areas. Furthermore, the angle may be set to near 90° to lower the mobility for a construction with a high degree of resistance between the source and drain areas, i.e., a high resistance of the channel-forming area.

EXAMPLE 5

This Example is a case in which, in the process of crystallization of the non-single crystal silicon semiconductor film in Example 1 or Example 2, a chlorine-added silicon dioxide film is formed and then crystallized by lamp heating. In Examples 1 and 2, first the formation of the non-single crystal silicon film was followed by crystallization of the silicon film by heating at 550° C. for 4 hours, and then the crystallinity was enhanced and improved by lamp heating. This process in this Example is further developed, in that during the lamp heating the catalyst element for crystallization is subjected to gettering.

In this Example, a crystalline silicon film is first formed by heating in the manner explained in Examples 1 and 2. This step is performed by the action of a catalyst element (for example, nickel) with heat annealing at 550° C. for about 4 hours. After this, a chlorine-added silicon oxide film is formed to a thickness of 1000 Å. Lamp heating is then performed via the silicon dioxide film. The conditions of the lamp heating are the same as in Example 1. Here, the crystallinity of the crystalline silicon film crystallized by the preceding heating is improved (the densification of the film is promoted), while the action of the chlorine in the silicon dioxide film results in gettering of the catalyst element for its crystallization. Thus there may be obtained a crystalline silicon film in which the catalyst element is fixed and thus its influence on the operation of the device is lowered.

The chlorine-added silicon dioxide film is then removed, and a silicon dioxide film is formed as the gate insulation film. The remaining subsequent steps are the same as explained in Examples 1 and 2.

EXAMPLE 6

This Example is a case in which, in the preparation process of Example 2 shown in FIG. 3, a nickel silicide film is formed on the entire upper surface of the underlying film 202 to induce crystal growth over the entire surface of the silicon film in a direction perpendicular to the substrate. The preparation of the TFT is carried out by the formation a nickel silicide film on the entire upper surface of the underlying film 202 with no mask 203, followed by the formation of an amorphous silicon film 205 in the manner explained in Example 2, and an additional step of cystallization.

A rough cross-sectional view of the TFT according to this Example is no different from the one shown in FIG. 3 (D), but the direction of growth of the needle-like or columnar crystals in the active layer, wherein are formed the source/drain regions 208, 210 and the channel-forming region 209, is perpendicular with respect to the substrate 201. As a result, the carrier which migrates between the source region (208 or 210) and the drain region (210 or 208) migrates in a manner which intersects the crystal grain boundary of the needle-like or columnar crystals. Consequently, the TFT has a slightly high resistance between the source and drain areas. Such a TFT has a degree of mobility of 100 $cm^2/Vs$ or less, but since the off-state current thereof is low, it is an ideal type as a TFT for a picture element of a liquid crystal display which is used for charge retention.

Nevertheless, a TFT such as the one in this Example has problems of yield and reliability since the nickel concentration in the active layer is difficult to control as described above. These problems may be lessened by using a method (such as ion implantation) which allows control of the amount of nickel introduced.

EXAMPLE 7

This Example is a case in which crystallization is further promoted by ion implantation of a Group IV element in addition to the Group VIII element which is the catalyst element for the crystallization by heating. The preparation process for this Example will be explained with reference to FIG. 1. Here, unless otherwise specified, the preparation conditions and film thicknesses in each step of preparation are the same as explained in Example 1.

First, an underlying film (silicon dioxide film) is formed on a glass substrate 101, a mask 103 is further formed thereon, and the Group VIII element (nickel in this case), which is the catalyst element for selective crystallization, is formed as a thin film on the exposed area of 100. The mask 103 is then removed, and a non-single crystal silicon film, here an amorphous silicon film 104 is formed thereon by the plasma CVD method. Next, the Group IV element silicon is implanted into the entire surface by the ion implantation method. Here, the projected range is set to the side of the substrate near the interface between the silicon film 104 and the underlying film 102. The acceleration voltage of the ion implantation is 60 kV, and the dose is $2 \times 10^{15}$ $cm^{-2}$. As a result, it is possible to thoroughly make amorphous the area of and near the interface between the substrate (including the underlying film) and the amorphous silicon film 104, thus minimizing the presence of crystallization nuclei.

A Group IV element is used here because it is an impurity which is electrically neutral with respect to silicon. The Group IV element used may be C, Si, Ge, Sn or Pb, but Si, Ge and Sn are particularly preferred. Also, the dose may be $5 \times 10^{14}$–$5 \times 10^{16}$ $cm^{-2}$.

After this, the amorphous silicon film 104 is crystallized by heating at 550° C. for 4 hours. Here, the crystal growth occurs from the area of 100 in a direction parallel to the substrate as shown by the arrow 105. This crystal growth is either needle-like or columnar. The crystal components which will become the nuclei of the crystal growth primarily at the interface between the substrate and the amorphous silicon film (although it is called an amorphous silicon film, this is a matter of degree and crystal components are still present) are removed by the previously implanted silicon ions, and consequently during the crystal growth, the crystal growth occurring parallel to the substrate from the area of 100 is not impeded by crystal growth developed from the interface between the silicon film 104 and the underlying film 102, thus allowing crystal growth with satisfactory orientation, i.e., crystal growth in a uniform direction.

Then, as explained in Example 1, a PTFT and NTFT are formed to complete the complementary TFT circuit. In a crystalline silicon film with satisfactory orientation such as in this Example, if the TFT is formed so that the directions of crystal growth and migration of the carrier are uniform then the carrier will migrate along the crystal grain boundary, and thus a structure is provided in which there is practically no effect of the crystal grain boundary during the migration. In other words, high-speed operation becomes possible. For example, the mobility of the NTFT formed by the process given in Example 1 was 90–130 $cm^2/Vs$, but the one in the present Example formed by implantation of silicon ions prior to the crystallization by heat had a mobility of 150–170 $cm^2/Vs$.

The further improved crystallinity and the obtaining of a TFT with a high degree of mobility observed in this Example is thought to be due to the fact that with crystal growth parallel to the substrate proceeding from the area in which the Group VIII element nickel had been introduced, since crystal components which would facilitate growth of crystals perpendicular to the substrate and thus interfere with the above crystal growth had been thoroughly removed in advance, the crystal growth parallel to the substrate was predominant. It is considered as particularly effective to make the vicinity of an interface between the silicon film and its underlying surface (e.g. substrate) completely amorphous where nuclei exist from which crystals tend to grow perpendicularly to the substrate.

EXAMPLE 8

This Example is a case of an active-type liquid crystal display in which the peripheral driver circuit consists of TFTs, the preparation process for which is given in Examples 1 and 2, crystallized by the catalytic effect of the Group VIII element such as nickel, and the TFTs provided in the picture element section are constituted by own amorphous silicon TFTs.

As is publicly known, the TFTs of the peripheral driver circuit section of an active-type liquid crystal display are required to have a high degree of mobility (100 $cm^2/Vs$ or greater), and to be capable of allowing for the flow of a large on-state current; however, the TFTs provided in the picture element section must have a small off-state current for charge retention and a relatively low degree of mobility (about 10 $cm^2/Vs$) to avoid malfunction due to light irradiation.

These requirements are somewhat satisfied by constructing the peripheral circuit section using the TFTs described in Examples 1 and 2 and by forming the picture element section with publicly known TFTS which employ amorphous silicon (a-SiTFT). However, TFTs which employ amorphous silicon films have a mobility of 1 $cm^2/Vs$ or lower, and thus this aspect remains a problem.

EXAMPLE 9

This Example is an advancement of Example 8 in which the TFTs making up the peripheral circuit section have a high mobility of 100 $cm^2/Vs$ or greater as described in Examples 1 and 2, while the TFTs in the picture element section are those described in Examples 3 and 6.

The TFT described in Example 6 is constructed so that the crystal growth occurs in a direction perpendicular to the substrate, to make the crystal grain boundary perpendicular with respect to the flow of the carrier, and so that the carrier intersects multiple crystal grain boundaries. This type of TFT has a low degree of mobility because the migration of the carrier is impeded by the crystal grain boundary. However, since the off-state current is low, the charge retention factor may be increased, and thus it is suitable as a TFT for a picture element. Nevertheless, if nickel has been introduced as a thin film as in Examples 1 and 2, the reproducibility will be poor and the resulting mobility will be almost as high as 100 $cm^2/Vs$, it is over-specified as a picture element TFT.

In this Example, the above mentioned problems are solved by using an ion implantation method by which the introduction of nickel may be made while controlling its concentration. First, use of ion implantation overcomes the problem of poor reproducibility of the nickel concentration in the film. Furthermore, by lowering the nickel concentration in the film it is possible to slightly impair the crystallinity to reduce the degree of mobility. Naturally, the lowering of the mobility may be carried out using a means of increasing the resistance between the source and the drain, for example, a method in which oxygen or nitrogen is purposely introduced into the channel region and the source/drain region, a method in which the amount of the conductivity type-imparting impurity doped into the source/drain regions is reduced, or the activation process is shortened to increase the resistance of the source/drain regions, a method in which the channel is made a weak reverse conductivity type with respect to the source/drain regions, and a method in which the positions of the contact holes of the source and drain are more distantly separated (that is, the sheet resistance of the source/drain regions is utilized), etc.

Thus, this Example employs a method by which nickel, which is the catalyst element for crystallization of the silicon film, is implanted into an amorphous silicon film by the ion implantation method, and at that time the nickel is implanted at a low concentration over the entire surface of the picture element section while it is implanted into the peripheral circuit section at a higher concentration, and further a TFT is formed in the picture element section by making use of a crystalline silicon film in which the crystal growth has occurred in a direction perpendicular to the substrate, and a TFT is formed in the peripheral circuit section by making use of a crystalline silicon film in which the crystal growth has occurred in a direction parallel to the substrate at the peripheral circuit section. Furthermore, with such a construction the resulting TFT has a low level of off-state current with a mobility of about 10–50 $cm^2/Vs$ in the picture element section and a large level of on-state current with a mobility of 100 $cm^2/Vs$ or greater in the peripheral circuit section.

In addition, if only the peripheral circuit section is made to have a high degree of mobility, then ion implantation of a neutral element may be effected in that area, as explained in Example 7.

As mentioned above, for a TFT which employs a non-single crystal silicon semiconductor film wherein the crystal growth has occurred parallel to the surface of the substrate, the direction of the flow of the carrier migrating in the TFT is matched to the direction in which the crystal growth occurred for a construction in which the migration of the carrier is along (parallel to) the crystal grain boundary of the needle-like or columnar crystals, to obtain a TFT with a high degree of mobility. Furthermore, since such TFTs may be formed at temperatures of as low as 600° C. or below, it is possible to use inexpensive glass as the substrate.

In addition, TFTs having different demanded degrees of mobility may be selectively made. Specifically:

1. Using a crystalline silicon film in which the crystal growth is parallel to the substrate, a TFT is prepared so that the migration of the carrier is along the crystal grain boundary.
2. Using a crystalline silicon film in which the crystal growth is parallel to the substrate, a TFT is prepared so that the migration of the carrier intersects the crystal grain boundary.
3. A TFT is prepared in the areas in which crystal growth has occurred in the direction perpendicular to the substrate.
4. A catalyst element is partially introduced for crystallization to selectively form a crystalline silicon film which is used to increase the mobility of specific sections of the TFT.

In particular, since the crystalline silicon film at the areas distant from the area in which the catalyst element has been introduced for crystallization has a linear orientation, this linear orientation may be roughly matched with the direction of migration of the carrier to obtain a semiconductor device having a carrier with a high degree of mobility. Particularly, by employing this construction in the channel-forming areas of an insulated gate-type field effect transistor, a high-speed response TFT may be obtained.

The embodiments were chosen and described in order to explain the principles of the invention and its practical application to enable one skilled in the art to utilize the invention in various embodiments and with various modifications as are suited to the particular use contemplated. For example, while a carrier mobility of a TFT can be maximized when the source/drain direction (i.e. the direction along the channel length) completely coincides with the crystal growth direction, a satisfactorily high mobility can be obtained if these directions intersect with each other at an angle within plus-minus 20°. Therefore, it is the inventors' intention that these directions are interpreted as substantially parallel with each other as long as these directions intersect at an angle within this range even if they are not completely parallel with each other.

What is claimed is:

1. A semiconductor device comprising:
   a substrate having an insulating surface; and
   at least one thin film transistor formed over said substrate, said thin film transistor including a crystalline semiconductor film comprising silicon added with a Group IV element in addition to a crystallization promoting material,
      wherein a crystal growth direction of said crystalline semiconductor film is approximately parallel with said insulating surface.

2. A semiconductor device according to claim 1 wherein said Group IV element is selected from the group consisting of C, Ge, Sn and Pb.

3. A semiconductor device according to claim 1 wherein said crystallization promoting material is nickel.

4. A semiconductor device according to claim 1 wherein said semiconductor device is an active matrix-type liquid crystal display.

5. A semiconductor device according to claim 1 wherein said semiconductor device is an integrated sensor including at least one peripheral driver circuit and at least one sensor integrated over said substrate.

6. A semiconductor device comprising:
   a substrate having an insulating surface; and
   at least one thin film transistor formed over said substrate, said thin film transistor including a crystalline semiconductor film comprising silicon added with a Group IV element in addition to a crystallization promoting material,
      wherein a crystal growth direction of said crystalline semiconductor film is approximately parallel with said insulating surface, and
      wherein a concentration of said Group IV element is $5 \times 10^{14}$ to $5 \times 10^{16}$ cm$^{-2}$.

7. A semiconductor device according to claim 6 wherein said Group IV element is selected from the group consisting of C, Ge, Sn, and Pb.

8. A semiconductor device according to claim 6 wherein said crystallization promoting material is nickel.

9. A semiconductor device according to claim 6 wherein said semiconductor device is an active matrix-type liquid crystal display.

10. A semiconductor device according to claim 6 wherein said semiconductor device is an integrated sensor including at least one peripheral driver circuit and at least one sensor integrated over said substrate.

11. A semiconductor device comprising:
    a substrate having an insulating surface; and
    at least one thin film transistor formed over said substrate, said thin film transistor including a crystalline semiconductor film comprising silicon added with germanium in addition to a crystallization promoting material,
       wherein a crystal growth direction of said crystalline semiconductor film is approximately parallel with said insulating surface.

12. A semiconductor device according to claim 11 wherein said crystallization promoting material is nickel.

13. A semiconductor device according to claim 11 wherein said semiconductor device is an active matrix-type liquid crystal display.

14. A semiconductor device according to claim 11 wherein said semiconductor device is an integrated sensor including at least one peripheral driver circuit and at least one sensor integrated over said substrate.

15. A semiconductor device comprising:
    a substrate having an insulating surface; and
    at least one thin film transistor formed over said substrate, said thin film transistor including a crystalline semiconductor film comprising silicon added with a Group IV element in addition to a crystallization promoting material,
       wherein a concentration of said crystallization promoting material is $2 \times 10^{19}$ cm$^{-3}$ or less.

16. A semiconductor device according to claim 15 wherein said Group IV element is selected from the group consisting of C, Ge, Sn and Pb.

17. A semiconductor device according to claim 15 wherein said crystallization promoting material is nickel.

18. A semiconductor device according to claim 15 wherein said semiconductor device is an active matrix-type liquid crystal display.

19. A semiconductor device according to claim 15 wherein said semiconductor device is an integrated sensor including at least one peripheral driver circuit and at least one sensor integrated over said substrate.

20. A semiconductor device according to claim 15 wherein the concentration of said crystallization promoting material is a value measured by SIMS.

21. A semiconductor device comprising:

a substrate having an insulated surface; and at least one thin film transistor formed over said substrate, said thin film transistor including a crystalline semiconductor film comprising silicon added with a Group IV element in addition to a crystallization promoting material, wherein the concentration of said crystallization promoting material is $2 \times 10^{19}$ cm$^{-3}$ or less, and wherein a concentration of said Group IV element is $5 \times 10^{14}$ to $5 \times 10^{16}$ cm$^{-2}$.

22. A semiconductor device according to claim 21 wherein said Group IV element is selected from the group consisting of C, Ge, Sn and Pb.

23. A semiconductor device according to claim 21 wherein said crystallization promoting material is nickel.

24. A semiconductor device according to claim 21 wherein said semiconductor device is an active matrix-type liquid crystal display.

25. A semiconductor device according to claim 21 wherein said semiconductor device is an integrated sensor including at least one peripheral driver circuit and at least one sensor integrated over said substrate.

26. A semiconductor device according to claim 21 wherein the concentration of said crystallization promoting material is a value measured by SIMS.

27. A semiconductor device comprising:

a substrate having an insulating surface; and at least one thin film transistor formed over said substrate, said thin film transistor including a crystalline semiconductor film comprising silicon added with germanium in addition to a crystallization promoting material, wherein a concentration of said crystallization promoting material is $2 \times 10^{19}$ cm$^{-3}$ or less.

28. A semiconductor device according to claim 27 wherein said crystallization promoting material is nickel.

29. A semiconductor device according to claim 27 wherein said semiconductor device is an active matrix-type liquid crystal display.

30. A semiconductor device according to claim 27 wherein said semiconductor device is an integrated sensor including at least one peripheral driver circuit and at least one sensor integrated over said substrate.

31. A semiconductor device according to claim 27 wherein the concentration of said crystallization promoting material is a value measured by SIMS.

32. A semiconductor device comprising:

a substrate having an insulating surface; and at least one thin film transistor formed over said substrate, said thin film transistor including a crystalline semiconductor film comprising silicon added with a Group IV element in addition to a crystallization promoting material.

33. A semiconductor device according to claim 32 wherein said Group IV element is selected from the group consisting of C, Ge, Sn and Pb.

34. A semiconductor device according to claim 32 wherein said crystallization promoting material is nickel.

35. A semiconductor device according to claim 32 wherein said semiconductor device is an active matrix-type liquid crystal display.

36. A semiconductor device according to claim 32 wherein said semiconductor device is an integrated sensor including at least one peripheral driver circuit and at least one sensor integrated over said substrate.

37. A semiconductor device comprising:

a substrate having an insulating surface; and at least one thin film transistor formed over said substrate, said thin film transistor including a crystalline semiconductor film comprising silicon added with a Group IV element in addition to a crystallization promoting material, wherein a concentration of said Group IV element is $5 \times 10^{14}$ to $5 \times 10^{16}$ cm$^{-2}$.

38. A semiconductor device according to claim 37 wherein said Group IV element is selected from the group consisting of C, Ge, Sn and Pb.

39. A semiconductor device according to claim 37 wherein said crystallization promoting material is nickel.

40. A semiconductor device according to claim 37 wherein said semiconductor device is an active matrix-type liquid crystal display.

41. A semiconductor device according to claim 38 wherein said semiconductor device is an integrated sensor including at least one peripheral driver circuit and at least one sensor integrated over said substrate.

* * * * *